(12) United States Patent
Pelin

(10) Patent No.: US 10,031,175 B1
(45) Date of Patent: Jul. 24, 2018

(54) METHOD FOR DETERMINING A LIGHT-EMISSION CAPACITY OF A LIGHT EMITTING DIODE

(71) Applicant: SAGEMCOM BROADBAND SAS, Rueil Malmaison (FR)

(72) Inventor: Patrice Pelin, Rueil Malmaison (FR)

(73) Assignee: SAGEMCOM BROADBAND SAS, Rueil-Malmaison (FR)

( * ) Notice: Subject to any disclaimer, the term of this patent is extended or adjusted under 35 U.S.C. 154(b) by 0 days.

(21) Appl. No.: 15/738,348

(22) PCT Filed: Jun. 28, 2016

(86) PCT No.: PCT/EP2016/064943
§ 371 (c)(1),
(2) Date: Dec. 20, 2017

(87) PCT Pub. No.: WO2017/001370
PCT Pub. Date: Jan. 5, 2017

(30) Foreign Application Priority Data

Jul. 1, 2015 (FR) ..................................... 15 56198

(51) Int. Cl.
*H05B 33/08* (2006.01)
*G09G 3/34* (2006.01)
*G01R 31/26* (2014.01)

(52) U.S. Cl.
CPC ..... *G01R 31/2635* (2013.01); *H05B 33/0893* (2013.01)

(58) Field of Classification Search
CPC .... H05B 37/02; H05B 33/08; H05B 33/0893; G09G 3/3406; G01R 31/2635
USPC ........ 315/127, 149, 155, 156, 159, 291, 307
See application file for complete search history.

(56) References Cited

U.S. PATENT DOCUMENTS

| 6,664,744 B2 * | 12/2003 | Dietz ................... G09G 3/3406 315/291 |
| 6,870,148 B2 | 3/2005 | Dietz et al. |
| 2014/0074434 A1 | 3/2014 | De Lima et al. |
| 2014/0225511 A1 | 8/2014 | Pickard et al. |

OTHER PUBLICATIONS

Sep. 29, 2016 Search Report issued in International Patent Application No. PCT/EP2016/064943.

* cited by examiner

*Primary Examiner* — Jimmy Vu
(74) *Attorney, Agent, or Firm* — Oliff PLC; R. Brian Drozd

(57) ABSTRACT

Method for determining a light-emission capacity of a light emitting diode, referred to as a LED. The method includes the following steps: reverse biasing the LED so as to cause an accumulation of an electric charge by the LED, said LED being subjected to a light source incident to the LED; causing a discharge of the electric charge accumulated by the LED; obtaining a value representing a time taken for discharging the charge from the LED; determining the light-emission capacity of the LED according to the discharge time obtained.

15 Claims, 3 Drawing Sheets

METHOD FOR DETERMINING A LIGHT-EMISSION CAPACITY OF A LIGHT EMITTING DIODE

The invention relates to a method for determining a light-emission capacity of a light emitting diode, and a device implementing said method.

A light emitting diode (LED) is an optoelectronic component capable of emitting light when an electric current passes through it. A LED comprises a cathode and an anode and allows an electric current to pass in only one direction, in a direct or passing direction, going from the anode to the cathode. When it has a current passing through it, a LED produces non-coherent monochromatic or polychromatic radiation.

Direct biasing is spoken of when a potential difference is applied to a LED and the potential applied to the anode is greater than the potential of the cathode. Conversely, reverse biasing is spoken of when the potential difference applied to a LED is such that the potential applied to the cathode is greater than the potential applied to the anode. Only direct biasing allows a current to pass in a LED.

At the present time, LEDs are frequently used for signalling, for data display, for example in screens, or for lighting. It is known that, as they are used, LEDs undergo ageing phenomena that result in a reduction in the light-emission capacity of said LEDs. Consequently, the more a LED is used, the more its light-emission capacity decreases. Moreover, the light-emission capacity of a LED may also be affected by dirt or dust accumulated over time.

A reduction in the light-emission capacity of a LED may have annoying consequences. For example, when a LED is used for signalling, a reduction in the light-emission capacity of the LED may give rise to a faulty interpretation of information conveyed by said LED. In another context, when a LED is used for lighting, for example in vehicle headlights, a reduction in the light-emission capacity of the LED may cause safety problems.

Methods exist for determining the light-emission capacity of a LED. In a first method, light sensors are positioned in the vicinity of a LED, in order to measure the light-emission capacity of the LED. Introducing a light sensor in a device comprising LEDs gives rise to an increase in manufacturing cost of said device, which may be detrimental for certain inexpensive devices. Moreover, numerous implementation problems are posed such as, for example, a problem in positioning said sensor at a judicious position with respect to the LED in order not to interfere with the emission of light by the LED, or a problem of taking into account ambient lighting when the LED is subjected to ambient lighting.

In a second method, the light-emission capacity of a LED is modelled by means of a mathematical model, for example taking into account a duration of use of the LED, a current passing through the LED and a temperature of use of the LED. However, obtaining a reliable mathematical model is often difficult since firstly a LED has characteristics dependent on manufacturing conditions under which said LED was produced, and secondly parameters not taken into account in the mathematical model (such as humidity level, ultraviolet radiation or degradation of materials making up the LED) may prove to be relevant for characterising a change over time in the light-emission capacities of a LED.

It is desirable to overcome these drawbacks of the prior art.

It is in particular desirable to propose a method for determining the light-emission capacity of a LED that is simple to implement at low cost. It is also desirable to propose a method for compensating for a phenomenon of ageing of a LED.

According to a first aspect of the present invention, the present invention relates to a method for determining a light-emission capacity of a light emitting diode, referred to as a LED, said LED comprising a cathode and an anode connected to ports of a control device, referred to respectively as cathode port and anode port. The method comprises the following steps: reverse-biasing the LED so as to cause an accumulation of an electric charge by the LED, said LED being subjected to a light source incident to the LED; controlling the cathode port and the anode port in order to cause a discharge of the electric charge accumulated by the LED; obtaining a value representing a time taken for discharging the charge from the LED; determining the light-emission capacity of the LED as a function of the discharge time obtained.

In this way, use is made of correlations existing between the light-emission capacity of a LED and its discharge time, which represents a light-capture capacity of the LED when it is reverse biased.

According to one embodiment, simultaneously with the control of the cathode port and anode port in order to cause a discharge of the electric charge accumulated by the LED, a counter is started, a value of said counter being incremented periodically by one unit with a predefined period as long as a voltage measured between the anode and the cathode of the LED is greater than a predefined threshold voltage, the value of said counter obtained when the voltage measured between the anode and the cathode of the LED becomes less than or equal to the predefined threshold voltage being the value representing a discharge time for the LED.

A simple method for measuring the discharge time of a LED and thus its light-emission capacity is thus proposed.

According to one embodiment, a correction value is applied to the value of said counter obtained when the voltage measured between the anode and the cathode of the LED becomes less than or equal to the predefined threshold value, said value of said counter after application of the correction value being the value representing a discharge time for the LED, the correction value being obtained from a correction function determined by making light-emission capacity measurements and light-capture capacity measurements on a predefined set of LEDs.

According to one embodiment, said value of said counter is initialised to zero at each reverse biasing of the LED.

According to one embodiment, following the starting of the counter, the counter is stopped if a time elapsed since the starting thereof reaches a predefined time value.

According to one embodiment, the cathode port and the anode port are logic input/output ports, and the predefined threshold voltage is a voltage for switching the cathode port from an input state to an output state.

According to one embodiment, a correction procedure is initiated according to the information representing the light-emission capacity of the LED determined.

According to one embodiment, the correction procedure indicates to an operator that the LED must be replaced.

According to one embodiment, the correction procedure comprises: determining a current to be applied to the LED when the LED is direct biased, according to the light-emission capacity of the LED determined, and a light-emission capacity to be achieved; and applying the current determined to the LED when the LED is direct biased.

According to a second aspect of the invention, the invention relates to a method for homogenising light emitted by each LED in a plurality of LEDs of a device, each LED comprising a cathode and an anode both connected to ports of a control device, the method according to the first aspect being applied for each LED.

According to one embodiment, the light-emission capacity to be achieved is a light-emission capacity determined for one of the LEDs in the plurality of LEDs, selected according to a predefined criterion.

According to one embodiment, the predefined criterion selects the light-emission capacity determined as being the highest among the light-emission capacities determined for each LED in the plurality of LEDs, or the light-emission capacity determined as being the lowest among the light-emission capacities determined for each LED in the plurality of LEDs, or a light-emission capacity determined as being median among the light-emission capacities determined for each LED in the plurality of LEDs.

According to a third aspect of the invention, the invention relates to a device for determining a light-emission capacity of a light emitting diode, referred to as a LED, said LED comprising a cathode and anode connected to ports of said device, referred to respectively as cathode port and anode port. The device comprises: control means for biasing the LED in the reverse direction so as to cause an accumulation of an electric charge by the LED, said LED being subjected to a source of light incident to the LED; control means for controlling the cathode port and the anode port in order to cause a discharge of the electric charge accumulated by the LED; obtaining means for obtaining a value representing a time taken for discharging the charge from the LED; determination means for determining the light-emission capacity of the LED according to the discharge time obtained.

According to a fourth aspect of the invention, the invention relates to a computer program comprising instructions for the implementation, by a device, of the method according to the first or second aspect, when the program is executed by a processor of said device.

According to a fifth aspect of the invention, the invention relates to storage means, storing a computer program comprising instructions for the implementation, by a device, of the method according to the first or second aspect, when said program is executed by a processor of said device.

The features of the invention mentioned above, as well as others, will emerge more clearly from a reading of the following description of an example embodiment, said description being given in relation to the accompanying drawings, among which:

Figure 1:
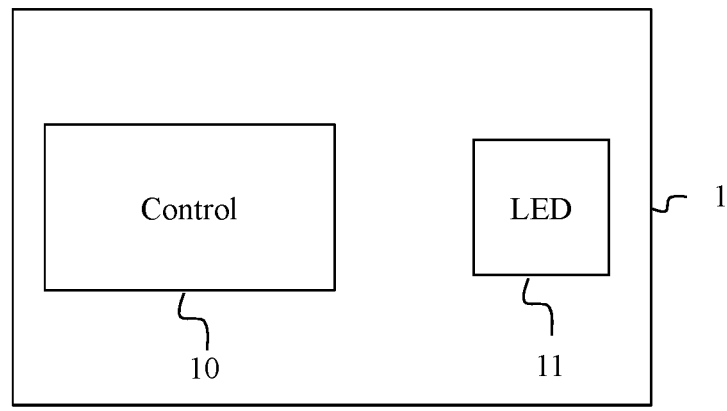
FIG. 1 illustrates schematically equipment in which the invention can be implemented.

FIG. 1 illustrates schematically equipment 1 in which the invention can be implemented. The equipment 1 comprises a control device 10 and at least one LED 11. Each LED 11 is connected to the control device 10, so that each LED 11 is controlled by the control device 10. The control device 10 controls in particular the emission of light by each LED 11.

Figure 2:
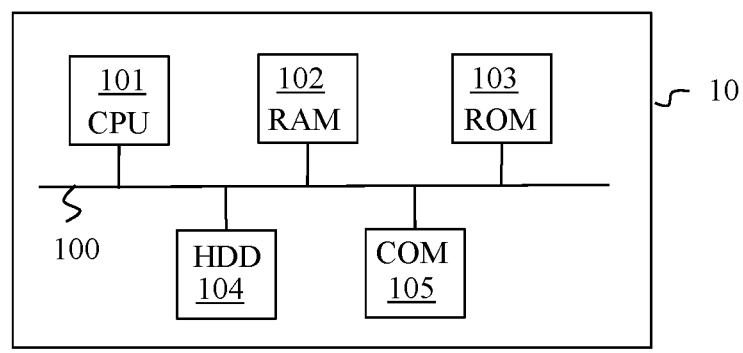
FIG. 2 illustrates schematically an example of hardware architecture of a control device suitable for implementing the invention.

FIG. 2 illustrates schematically an example of hardware architecture of the control device 10.

According to the example of hardware architecture shown in FIG. 2, the control device 10 then comprises, connected by a communication bus 100: a processor or CPU (central processing unit) 101; a random access memory (RAM) 102; a read only memory (ROM) 103; a storage unit such as a hard disk or a storage medium reader, such as a SD (secure digital) card reader 104; at least one communication interface 105 enabling the control device 10 to communicate with other devices, such as for example communication devices, for transmitting information representing a light-emission capacity of a LED.

The processor 101 is capable of executing instructions loaded into the RAM 102 from the ROM 103, from an external memory (not shown), from a storage medium (such as a SD card), or from a communication network. When the equipment 1 is powered up (and therefore when the control device 10 is powered up), the processor 101 is capable of reading instructions from the RAM 102 and executing them. These instructions form a computer program causing the implementation, by the processor 101, of the message described below in relation to FIGS. 4, 5, 6, 7A and 7B.

The method described in relation to FIGS. 4, 5, 6, 7A and 7B may be implemented in software form by the execution of a set of instructions by a programmable machine, for example a DSP (digital signal processor) or a microcontroller, or be implemented in hardware form by a machine or a dedicated component, for example an FPGA (field-programmable gate array) or an ASIC (application-specific integrated circuit).

Figure 3:
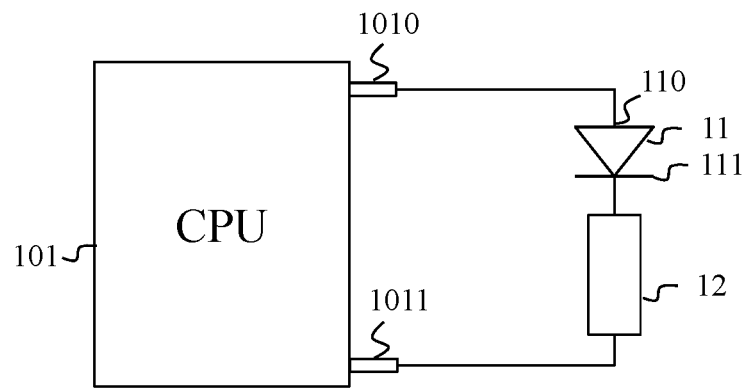
FIG. 3 illustrates schematically an example of connection of a LED to a processor of the control device.

FIG. 3 illustrates schematically an example of connection of a LED 11 to a processor 101 of the control device 10. The LED 11 comprises an anode 110 and a cathode 111. The anode 110 is connected to a port 1010 of the processor 101, referred to as the anode port, whereas the cathode 111 is connected to a port 1011 of the processor 101, referred to as the cathode port. A resistor 12 is positioned in series between the cathode 111 and the port 1011. The anode port 1010 and the cathode port 1011 are logic input/output ports that can be switched alternately into an input state or into an output state, at predefined potentials, or as a current source.

When the LED 11 is to emit light, a potential difference is applied to the LED 11 such that the potential of the anode 110 is higher than the potential of the cathode 111. In this case, the LED 11 is direct biased.

It should be noted that, in this embodiment, the LED 11 is connected directly to the processor 101 of the control device 10. In another embodiment, the LED 11 may be connected to logic input/output ports of the control device 10 independent of the processor 101 but controlled by the processor 101.

Figure 4:
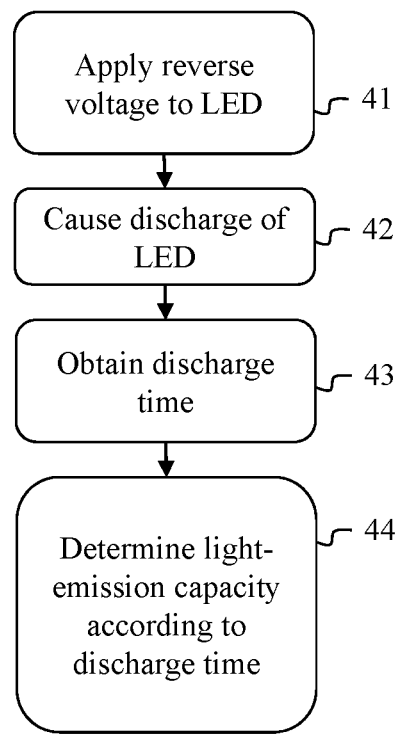
FIG. 4 illustrates schematically a method for determining a light-emission capacity of a LED.

FIG. 4 illustrates schematically a method for determining a light-emission capacity of a light emitting diode. The method described in relation to FIG. 4 is applied to the LED 11.

The method of FIG. 4 is based on a general characteristic of LEDs, which is that a reversed-biased LED behaves approximately as a capacitor having a capacitance C dependent on an incident light perceived by the LED. This characteristic allows to use a LED as a light sensor. Moreover, it is considered in the invention that the light-emission capacity of a LED when it is direct biased is proportional to a light-capture capacity of said LED when it is reverse biased. Thus it is considered that, when the light-emission capacity of a LED varies because of an ageing of said LED, the light-capture capacity of said LED varies in the same way. Consequently the invention consists of obtaining information representing the light-capture capacity of a LED in order to derive therefrom information representing the light-emission capacity of said LED.

In a step 41, the control device 10 reverse-biases the LED 11 so as to cause an accumulation of an electric charge by the LED. During the biasing, the LED 11 is subjected to an incident light source. The incident light is for example an ambient light surrounding the equipment 1. The reverse biasing of the LED 11 is done for a period ranging from a few milliseconds to several seconds.

In a step 42, the control device 10 controls the anode port 1010 and the cathode port 1011 in order to cause a discharge of the electric charge accumulated by the LED 11. To do this, the cathode port 1011 is switched as an input. The discharge of the electric charge of the LED 11 behaves as a discharge of a capacitor of capacitance C. A voltage U(t) between the anode and the cathode of the LED 11 being discharged is given by the following equation:

$$U(t) = U_{max} e^{-\frac{t}{RC}}$$

where R is an input resistance value of the cathode port 1011, t is a variable representing variations in time and $U_{max}$ is a maximum voltage between the anode and the cathode of the LED 11 at the start of the discharge.

Figure 5:
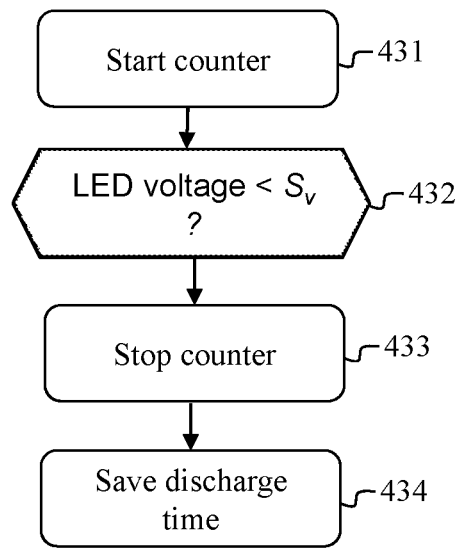
FIG. 5 illustrates schematically a procedure for determining a value representing a time taken for discharging a charge of a LED.

In a step 43, the control device 10 obtains a value $N_D$ representing a time taken for discharging the charge of the LED 11, in accordance with a method described in relation to FIG. 5. The time taken for discharging a LED represents the light-capture capacity of said LED 11. Thus a long discharge time for a LED indicates that said LED has a low light-capture capacity. Conversely, a short discharge time for a LED indicates that said LED has a high light-capture capacity.

In a step 44, the control device 10 determines the light-emission capacity of the LED 11 according to the discharge time obtained. In one embodiment, the value $N_D$, representing the discharge time obtained, is compared with a value $N_D^{REF}$, representing a reference discharge time.

In one embodiment the value $N_D^{REF}$ representing a reference discharge time was obtained when the equipment 1 was first powered up. It is assumed here that, when the equipment 1 is first powered up, the LED 11 has not yet suffered ageing and that consequently its light-emission capacity (and therefore its light-capture capacity) is at a maximum. In order to quantify a reduction in the light-emission capacity (and therefore its light-capture capacity) of the LED 11, the control module calculates a percentage P from the value $N_D$ representing the discharge time obtained, and the value $N_D^{REF}$ representing a reference discharge time:

$$P = \frac{N_D^{REF}}{N_D} \times 100$$

Consequently, from each measurement of the value $N_D$ representing the discharge time for the LED 11, the control device 10 is capable of determining that the light-emission capacity of the LED 11 is equal to P % of its maximum light-emission capacity. The percentage P therefore represents the light-emission capacity of the LED 11.

In an embodiment in which the equipment 1 comprises a plurality of LEDs 11, steps 41, 42 and 43 of the method described in relation to FIG. 4 are implemented for each LED in the plurality of LEDs 11. A value $N_D$ representing the discharge time is obtained for each LED in the plurality of LEDs 11. When steps 41, 42 and 43 have been implemented for each LED in the plurality of LEDs 11, the value $N_D^{REF}$ representing a reference discharge time is determined. In this embodiment, the value $N_D^{REF}$ representing a reference discharge time used in step 44, is the lowest value among the values $N_D$ representing the discharge time that have been obtained. It is considered that the LED in the plurality of LEDs 11 having a value $N_D$ representing the lowest discharge time is the LED least affected by ageing. The processing device then calculates, in the same way as before, for each LED in the plurality of LEDs 11, a percentage P.

Consequently, from each measurement of each value $N_D$ representing the time taken for discharging a LED in the plurality of LEDs 11, the control device 10 is capable of determining that the light-emission capacity of each LED in the plurality of LEDs 11 is equal to P % of the light-emission capacity of the LED in the plurality of LEDs 11 that is least affected by ageing. The percentage P therefore represents the light-emission capacity of each LED in the plurality of LEDs 11.

In another embodiment in which the equipment 1 comprises a plurality of LEDs 11, steps 41, 42 and 43 of the method described in relation to FIG. 4 are implemented for each LED in the plurality of LEDs 11. A value $N_D$ representing the discharge time is obtained for each LED in the plurality of LEDs 11. When steps 41, 42 and 43 have been implemented for each LED in the plurality of LEDs 11, the value $N_D^{REF}$ representing a reference discharge time is determined. In this embodiment the value $N_D^{REF}$, representing the reference discharge time used in step 44, is the highest value among the values $N_D$ representing the discharge time that have been obtained. It is considered here that the LED in the plurality of LEDs 11 having the value $N_D$ representing the longest discharge time is the LED most affected by ageing. The processing device then computes, in the same way as before, for each LED in the plurality of LEDs 11, a percentage P.

Consequently, from each measurement of each value $N_D$ representing the discharge time for a LED in the plurality of LEDs 11, the control device 10 is capable of determining that the light-emission capacity of each LED in the plurality of LEDs 11 is equal to P % of the light-emission capacity of the LED in the plurality of LEDs 11 most affected by ageing.

In another embodiment in which the equipment 1 comprises a plurality of LEDs 11, steps 41, 42 and 43 of the method described in relation to FIG. 4 are implemented for each LED in the plurality of LEDs 11. A value $N_D$ representing the discharge time is obtained for each LED in the plurality of LEDs 11. When steps 41, 42 and 43 have been implemented for each LED in the plurality of LEDs 11, the value $N_D^{REF}$ representing a reference discharge time is determined. In this embodiment, the value $N_D^{REF}$ representing a reference discharge time used in step 44 is a median value among the values $N_D$ representing the discharge time that have been obtained. The processing device then, in the same way as before, for each LED in the plurality of LEDs 11, calculates a percentage P.

Consequently, from each measurement of each value $N_D$ representing the discharge time for a LED in the plurality of LEDs 11, the control device 10 is capable of determining that the light-emission capacity of each LED in the plurality of LEDs 11 is equal to P % of the light-emission capacity of a LED in the plurality of LEDs 11 having a median brightness.

Each percentage P calculated is stored for the control device 10 with a view to subsequent use that will be described in relation to FIGS. 6, 7A and 7B.

It should be noted that, in order to make each light-capture capacity measurement reliable and to be able to compare various light-capture capacity measurements with each other, it is preferable for each implementation of the method described in relation to FIG. 4 to be carried out at constant incident light. In one embodiment, each time the method described in relation to FIG. 4 is implemented, the equipment 1 is subjected to the same light source producing a constant incident light. In this way, each LED 11 of the equipment 1 is always subjected to the same incident light whenever the method described in relation to FIG. 4 is implemented.

In one embodiment, a light sensor situated in the vicinity of the equipment 1 is connected to the control device 10 and transmits measurements of the ambient light to it. The control device 10 triggers the method described in relation to FIG. 4 only when the light sensor transmits an ambient-light measurement equal to a predefined value, which makes it possible to ensure that each LED of the equipment 1 receives a constant incident light.

In one embodiment, suited to the case where the equipment 1 comprises a plurality of LEDs 11, a light sensor situated in the vicinity of the equipment 1 is connected to the control device 10 and transmits measurements of the ambient light to it. Using the ambient-light measurements, the control device 10 ensures that each LED in the plurality of LEDs 11 has been subjected to the same incident light during each implementation of the method described in relation to FIG. 4. In this way, the control device 10 ensures that the values $N_D$ representing the discharge time for each LED in the plurality of LEDs 11 can be compared with each other since each LED in the plurality of LEDs 11 has been subjected to the same incident light. If the control device finds that not all the LEDs in the plurality of LEDs 11 have received an identical incident light, it considers that the measurements of the values $N_D$ representing the discharge time for each LED in the plurality of LEDs 11 obtained are not valid. No corrective measure is then taken. In this embodiment, the light sensor could be one of the LEDs of the equipment 1, such as for example the least used LED, and therefore the LED that has undergone the least ageing.

FIG. 5 illustrates schematically a procedure for determining a value representing a discharge time for a charge of a light emitting diode. This procedure corresponds to an example of implementation of step 43 described in relation to FIG. 4. This procedure is used for each LED 11 of the equipment 1.

In a step 431, simultaneously with the switching of the cathode port 1011 to the input state, the control device 10 starts a counter. Following the starting of the counter, a value of the counter is incremented by one unit at predefined regular intervals (i.e. with a predefined period) as long as a voltage measured between the anode 110 and the cathode 111 of the LED 11 is higher than a predefined threshold voltage $S_v$. The predefined period can take values of around ten microseconds to a few milliseconds. The predefined period can be adapted to an intensity of the light source incident to the LED 11. The higher the intensity, the shorter the discharge time for the LED 11 and therefore the shorter the predefined period must be. Conversely, the lower the intensity, the longer the discharge time for the LED 11 and therefore the more extended can be the predefined period. In one embodiment, the predefined threshold voltage $S_v$ is a voltage for switching the cathode port 1011 from the input state to the output state. It should be noted that the value of the incremented counter is reinitialised to the value zero at each reverse biasing of the LED 11. In the example in FIG. 4, the value of the counter was therefore reinitialised to zero during step 41.

In a step 432, the control device 10 checks, at regular intervals corresponding for example to the predefined period, whether the voltage measured between the anode 110 and the cathode 111 of the LED 11 is lower than the predefined threshold voltage $S_v$. When the voltage measured between the anode 110 and the cathode 111 of the LED 11 becomes less than the predefined threshold voltage $S_v$, the control device 10 implements a step 433.

During step 433, the control device 10 stops the counter. The value taken by the counter when stopped corresponds to the value $N_D$ representing the discharge time for the LED 11.

During step 434, the control device 10 saves the value $N_D$ representing the discharge time for the LED 11.

In one embodiment, step 432, during which the control device 10 checks whether the voltage measured between the anode 110 and the cathode 111 of the LED 11 is lower than the predefined threshold voltage $S_v$, is implemented for a limited period $T_o$ corresponding to a counter value $N_o$. One objective of this embodiment is to not prolong a measurement of the value representing the discharge time for a LED 11 indefinitely, which would be detrimental to the correct functioning of the equipment 1. Two reasons can explain why the discharge time for a LED is long: either said LED has suffered ageing such that its light-emission capacity is almost zero, or said LED is subjected to ambient light that is too low for making a reliable measurement. In this case, the counter is stopped when it reaches the counter value $N_D=N_o$. If the value of the counter $N_o$ is reached without the voltage measured between the anode 110 and the cathode 111 of the LED 11 being lower than the predefined threshold voltage $S_v$, the counter value $N_D=N_o$ is saved during step 434.

In one embodiment, the limited period $T_o$ may also be defined according to any problem that could be caused by implementation of the method described in relation to FIG. 4. For example, when, in normal operation, the LED 11 must emit light continuously, it is preferable for the LED 11 to be switched off for a short period in order to avoid the switching off of said LED 11 being interpreted as a malfunctioning of said LED 11 or of the equipment 1. In one embodiment, it is considered that the light-emission capacity of a LED when it is direct biased is correlated with the light-capture capacity of said LED when it is reverse biased, without being directly proportional to the light-capture capacity of said LED when it is reverse biased. It is necessary in this case to correct the counter value $N_D$ obtained in order to obtain a corrected counter value $N_D^{Corr}$ representing a light-capture capacity of said LED. In one embodiment, the corrected counter value $N_D^{Corr}$ is obtained by applying a correction value $V_{Corr}$ to the counter value $N_D$.

$$N_D^{Corr}=V_{Corr}\times N_D$$

The correction value $V_{Corr}$ is obtained from a correction function F such that:

$$V_{Corr}=F(N_D)=A \times N_D$$

where A is a constant determined by making light-emission capacity measurements and light-capture capacity measurements, on a set of LEDs that have suffered variable ageing. When the counter value $N_D$ has been corrected, the counter value $N_D$ is replaced by the counter value $N_D^{Corr}$.

Figure 6:
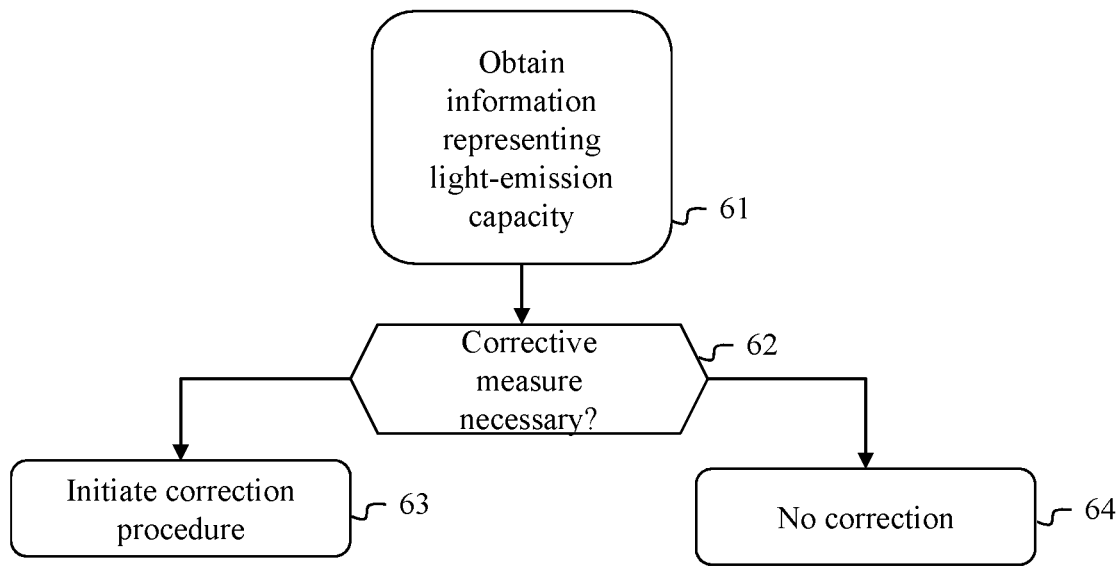
FIG. 6 illustrates schematically a procedure for processing information on the light-emission capacity of a light emitting diode.

FIG. 6 illustrates schematically a procedure for processing information on light-emission capacity of a LED. One objective of the procedure described in relation to FIG. 6 is using the information on light-emission capacity of a LED obtained using the method described in relation to FIG. 4, for applying corrective measures to the LEDs that have suffered ageing. The procedure described in relation to FIG. 6 is implemented for each LED 11 of the equipment 1.

In a step 61, the control device 10 obtains the percentage P representing the light-emission capacity of the LED 11. This percentage P is recovered in the storage unit 104 of the control device 10 in which it was previously stored.

In a step 62, the control device 10 determines whether corrective measures are to be applied to said LED. In one embodiment, the control device 10 checks whether the percentage P is included in a predefined set of values:

$$P \in [100-\varepsilon;\ 100+\varepsilon]$$

where $\varepsilon$ is a constant for example equal to 30%.

If the percentage P is included in the predefined set of values, the control device 10 implements a step 64. During step 64, the control device 10 decides that no correction procedure is to be implemented.

If the percentage P is outside the predefined set of values, the control device 10 implements a step 63. During step 63, the control device 10 implements a correction procedure.

It should therefore be noted that the correction procedure is initiated according to the light-emission capacity of the LED represented by the determined percentage P.

In an embodiment suited to the case where the equipment 1 comprises a plurality of LEDs 11, the control device 10 obtains for each LED in the plurality of LEDs 11 a percentage P and a counter value $N_D$. When all the counter values $N_D$ obtained are equal to the counter value $N_o$, the control device 10 considers that the incident light received by the LEDs in the plurality of LEDs 11 was insufficient to obtain reliable light-capture capacity measurements. In this case, no correction procedure is implemented. If, on the other hand, at least one of the counter values $N_D$ obtained is not equal to the counter value $N_o$, the light-capture capacity measurements are considered to be reliable.

Figure 7A:
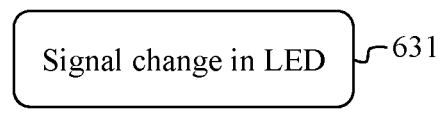
FIG. 7A illustrates schematically a first example of a procedure for correcting a light-emission capacity of a LED.

FIG. 7A illustrates schematically a first example of a procedure for correcting an emission capacity of a light emitting diode. The correction procedure described in relation to FIG. 7 is implemented during step 63.

In a step 631, the processing device 10 triggers a signalling procedure indicating that the LED 11 must be replaced. One objective of the signalling procedure is to inform an operator responsible for maintenance of the equipment 1 that the LED 11 must be replaced. In one embodiment, the control device 10 sends a message to the operator using the communication interface 105. The message indicates to the operator that the LED 11 must be replaced.

Figure 7B:
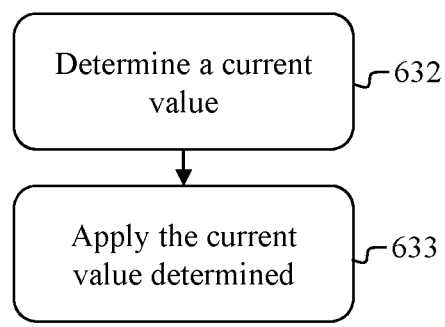
FIG. 7B illustrates schematically a second example of a procedure for correcting a light-emission capacity of at least one LED.

FIG. 7B illustrates schematically a second example of a procedure for correcting a light-emission capacity of a LED. The correction procedure described in relation to FIG. 7B is implemented during step 63. One objective of the procedure described in relation to FIG. 7B is to enable the control device 10 to control a current passing through the LED 11 in order to compensate for the ageing of said LED 11 or, when the equipment 1 comprises a plurality of LEDs 11, to rebalance the illumination supplied by the LEDs in the plurality of LEDs 11.

In a step 632, the control device 10 determines a corrected current $I_{corr}$ to be applied to the LED 11 when direct biasing is applied to the LED 11. The corrected current $I_{corr}$ to be applied is determined according to the light-emission capacity of the LED, represented by the percentage P determined, and a light-emission capacity to be achieved. In one embodiment, the light-emission capacity to be achieved is the capacity of a LED associated with the value $N_D^{REF}$ representing a reference discharge time.

When the equipment 1 comprises only one LED 11, the LED associated with the value $N_D^{REF}$ representing a reference discharge time is the LED 11 itself. In this case, the value $N_D^{REF}$ representing a reference discharge time is the discharge time value obtained during the first powering up of the equipment 1, when the LED 11 had not undergone any ageing.

It is then considered, during step 632, that, when the light-emission capacity of the LED 11 is equal to P % of its maximum light-emission capacity, it is necessary to increase the current passing through the LED 11 by (1/P) % with respect to the current I that passed through the LED 11 on first powering up. The corrected current $I_{corr}$ is then equal to:

$$I_{corr}=(1/P) \times 1$$

In a step 633, the control device 10 applies to the LED 11 the corrected current $I_{corr}$ determined.

In an embodiment suited to a case where the equipment 1 comprises a plurality of LEDs 11, the processing device 10 applies the method described in relation to FIG. 7B to each LED in the plurality of LEDs 11.

In another embodiment suited to a case where the equipment 1 comprises a plurality of LEDs 11, the LED in the plurality of LEDs 11 associated with the value $N_D^{REF}$ representing a reference discharge time is either the LED having the highest light-emission capacity among the LEDs in the plurality of LEDs 11, or the LED having the lowest light-emission capacity among the LEDs in the plurality of LEDs 11, or a LED having a median light-emission capacity among the LEDs in the plurality of LEDs 11. One objective of this embodiment is to homogenise the light emitted so that each LED in the plurality of LEDs emits identical brightness. The processing device 10 applies the method described in relation to FIG. 7B to each LED in the plurality of LEDs 11. When step 632 is implemented for a LED in the plurality of LEDs 11, a corrected current value is determined for said LED in the plurality of LEDs 11 using the percentage P determined for said LED:

$$I_{corr}=(1/P) \times I_{ref}$$

In this case, $I_{ref}$ is a value of the current passing through the LED in the plurality of LEDs 11, associated with the value $N_D^{REF}$ during the last implementation of the procedure described in relation to FIG. 5.

The invention claimed is:

1. A method for determining a light-emission capacity of a light emitting diode ("LED"), said LED comprising a cathode and an anode connected to ports of a control device, referred to respectively as cathode port and anode port, wherein the method comprises:
   reverse-biasing the LED so as to cause an accumulation of an electric charge by the LED, said LED being subjected to a light source incident to the LED;

controlling the cathode port and the anode port in order to cause a discharge of the electric charge accumulated by the LED;

obtaining a value representing a time taken for discharging the charge from the LED;

determining the light-emission capacity of the LED as a function of the discharge time obtained.

2. The method according to claim 1, wherein, simultaneously with the control of the cathode port and anode port in order to cause a discharge of the electric charge accumulated by the LED, a counter is started, a value of said counter being incremented periodically by one unit with a predefined period as long as a voltage measured between the anode and the cathode of the LED is greater than a predefined threshold voltage, the value of said counter obtained when the voltage measured between the anode and the cathode of the LED becomes less than or equal to the predefined threshold voltage being the value representing a discharge time for the LED.

3. The method according to claim 2, wherein a correction value is applied to the value of said counter obtained when the voltage measured between the anode and the cathode of the LED becomes less than or equal to the predefined threshold value, said value of said counter after application of the correction value being the value representing a discharge time for the LED, the correction value being obtained from a correction function determined by making light-emission capacity measurements and light-capture capacity measurements on a predefined set of LEDs.

4. The method according to claim 2, wherein said value of said counter is initialised to zero each time the LED is reverse biased.

5. The method according to claim 2, wherein, following the starting of the counter, the counter is stopped if a time elapsed since the starting thereof reaches a predefined time value.

6. The method according to claim 2, wherein the cathode port and the anode port are logic input/output ports, and the predefined threshold voltage is a voltage for switching the cathode port from an input state to an output state.

7. The method according to claim 1, wherein a correction procedure is initiated according to the information representing the light-emission capacity of the LED determined.

8. The method according to claim 7, wherein the correction procedure signals to an operator that the LED must be replaced.

9. The method according to claim 7, wherein the correction procedure comprises:

determining a current to be applied to the LED when the LED is direct biased, according to the light-emission capacity of the LED determined, and a light-emission capacity to be achieved; and applying the current determined to the LED when the LED is direct biased.

10. The method for homogenising light emitted by each LED in a plurality of LEDs of a device, each LED comprising a cathode and an anode both connected to ports of a control device, wherein the method according to claim 9 is applied for each LED.

11. The method according to claim 10 is applied for each LED, wherein the light-emission capacity to be achieved is a light-emission capacity determined for one of the LEDs in the plurality of LEDs selected according to a predefined criterion.

12. The method according to claim 11, wherein the predefined criterion selects the light-emission capacity determined as being the highest among the light-emission capacities determined for each LED in the plurality of LEDs, or the light-emission capacity determined as being the lowest among the light-emission capacities determined for each LED in the plurality of LEDs, or a light-emission capacity determined as being median among the light-emission capacities determined for each LED in the plurality of LEDs.

13. A device for determining a light-emission capacity of a light emitting diode, referred to as a LED, said LED comprising a cathode and an anode connected to ports of a control device, referred to respectively as cathode port and anode port, wherein the device comprises circuitry adapted for:

biasing the LED in the reverse direction so as to cause an accumulation of an electric charge by the LED, said LED being subjected to a source of light incident to the LED;

controlling the cathode port and the anode port in order to cause a discharge of the electric charge accumulated by the LED;

obtaining a value representing a time taken for discharging the charge from the LED;

determining the light-emission capacity of the LED according to the discharge time obtained.

14. A computer program product embodied in a non-transitory computer readable medium, the computer program product comprising instructions for the implementation, by a device, of the method according to claim 1, when said program is executed by a processor of said device.

15. A non transitory information storage medium storing a computer program comprising program code instructions which cause a processor to implement the method according to claim 1, when said program code instructions are executed by the processor.

* * * * *